United States Patent [19]

Rao

[11] Patent Number: 5,953,738
[45] Date of Patent: Sep. 14, 1999

[54] DRAM WITH INTEGRAL SRAM AND ARITHMETIC-LOGIC UNITS

[75] Inventor: G. R. Mohan Rao, Dallas, Tex.

[73] Assignee: Silicon Aquarius, Inc, Tex.

[21] Appl. No.: 08/886,952

[22] Filed: Jul. 2, 1997

[51] Int. Cl.[6] ........................................... G06F 12/00
[52] U.S. Cl. ........................ 711/105; 711/5; 711/114
[58] Field of Search ........................ 711/105, 5, 114; 365/230.03, 189.04; 364/900, 760.01

[56] References Cited

U.S. PATENT DOCUMENTS

| | | | |
|---|---|---|---|
| 4,755,962 | 7/1988 | Mor | 364/760.01 |
| 4,835,733 | 5/1989 | Powell | 364/900 |
| 5,355,335 | 10/1994 | Katsuno | 365/189.04 |
| 5,473,573 | 12/1995 | Rao | 365/230.01 |
| 5,528,550 | 6/1996 | Pawate et al. | 365/230.03 |
| 5,546,343 | 8/1996 | Elliott et al. | 365/189.04 |
| 5,654,931 | 8/1997 | Tamba et al. | 365/230.03 |
| 5,701,270 | 12/1997 | Rao | 365/230.03 |

*Primary Examiner*—John W. Cabeca
*Assistant Examiner*—Nasser Moazzami
*Attorney, Agent, or Firm*—James J. Murphy, Esq.; Winstead Sechrest & Minick

[57] ABSTRACT

Memory 400 is fabricated as a single integrated circuit chip and includes an array 402 of memory cells and circuitry 404/405/413 for accessing selected memory cells in array 402. At least one local ALU 414 is included for receiving data accessed from selected cells of array 402 and performing a selected operation thereon.

30 Claims, 12 Drawing Sheets

DRAM WITH INTEGRAL SRAM AND ARITHMETIC-LOGIC UNITS

CROSS-REFERENCE TO RELATED APPLICATIONS

The following co-pending and co-assigned United States Patent Applications contain related information and are incorporated herein by reference:

DRAM WITH INTEGRAL SRAM AND SYSTEMS AND METHODS USING THE SAME, U.S. patent application Ser. No. 08/816,663, (Attorney's Docket No. 17200-P001US), filed on Mar. 13, 1997; and DRAM WITH INTEGRAL SRAM AND SYSTEMS AND METHODS USING THE SAME, U.S. patent application Ser. No. 08/855,944, (Attorney's Docket No. 17200-P002US), filed on May 14, 1997.

BACKGROUND OF THE INVENTION

1. Field of the Invention

The present invention relates in general to electronic memories and in particular to a dynamic random access memory (DRAM) with integral static random access memory (SRAM), and systems and methods using the same.

2. Description of the Related Art

Currently available dynamic random access memories (DRAMs) are generally based upon architectures which share the following characteristics. First, the typical general purpose DRAM has a single data port for writing and reading data to and from addressed storage locations ("dual ported" DRAMs are available which provide two data ports, typically one random and one serial port, however, these devices are normally limited to special memory applications). Second, data writes and reads are only made on a location by location basis, with each location typically being one bit, one byte or one word wide. Specifically, in a "random access mode", an access (read or write) is made to a single location per row address strobe (/RAS) active cycle and in a "page mode" an access is made to a single location per column address strobe (/CAS) or master clock cycle of the row addressed during the given /RAS cycle. Third, no method has generally been established to handle contention problems which arise when simultaneous requests for access are made to the same DRAM unit. Current techniques for handling contention problems depend on the DRAM and/or system architecture selected by the designer and range, for example, from "uniform memory-noncontention" methods to "non-uniform memory access" (NUMA) methods.

Similarly, the system architectures of personal computers (PCs) generally share a number of common features. For example, the vast majority of today's PCs are built around a single central processing unit (CPU), which is the system "master." All other subsystems, such as the display controller, disk drive controller, and audio controller then operate as slaves to the CPU. This master/slave organization is normally used no matter whether the CPU is a complex instruction set computer (CISC), reduced instruction set computer (RISC), Silicon Graphics MIPS device or Digital Equipment ALPHA device.

Present memory and PC architectures, such as those discussed above, are rapidly becoming inadequate for constructing the fast machines with substantial storage capacity required to run increasingly sophisticated application software. The problem has already been addressed, at least in part, in the mainframe and server environments by the use of multiprocessor (multiprocessing) architectures. Multiprocessing architectures however are not yet cost effective for application in the PC environment. Furthermore, memory contention and bus contention are still significant concerns in any multiprocessing system, let alone in a multiprocessing PC environment.

A CPU typically operates exchanges data with memory in terms of "cache lines." Cache lines are a unit of data by which operandi and results can be stored or retrieved from memory and operated on by the CPU in a coherent fashion. Cache lines accesses are made both to cache and to system memory.

In systems operating with CPUs having a 32-bit data I/O port, a cache line is normally eight (8) 32-bit words or 256 bits. In the foreseeable future, data I/O ports will be 64 bits wide, and cache lines may be comprised of 16 64-bit data words or 1024 bits in length. Typically, the CPU may read a cache line from a corresponding location in memory, perform an arithmetic or logic operation on that data and then write the result back to the same location in system or cache memory. A given location for a cache line can be in one or more physical rows in memory and therefore an access to cache line location may require multiple RAS cycles. In any event, the CPU, depending on the operating system running, can generally access any location in memory for storing and retrieving operandi and results.

Often situations arise when the results from a given operation exceed the length of the cache line and therefore data can no longer be processed as coherent cache line units. For example, if the CPU performs a n by n bit integer multiplication, the result could be a maximum of 2n bits. In other words, while each operand can be retrieved from memory as a cache line, the result exceeds the length of a single cache line and coherency is lost. Similarly, when operandi containing decimal points or fractions are involved, exceeding the length of a cache line can also take place. In the case of fractions, long strings of bits, which exceed cache line length, may be required to minimize rounding errors and therefor increase the precision of the calculations.

In any computing system, and in particular multiprocessing systems, the ability to operate on data as cache lines substantially improves operating efficiency. Thus, when a cache line is exceeded during an operation, system performance is reduced. Specifically, when a cache line is exceeded, the CPU must either access that data as two cache lines or as a cache line and additional discrete words or doublewords of data. As result, extra memory cycles are required to execute an operation and the transfer of data within the system is more difficult because the necessary data is no longer in a straight forward cache line data structures.

Thus, the need has arisen for new memory and system architectures in which operations can be performed on coherent units of data, even if cache lines are exceeded.

BRIEF DESCRIPTION OF THE DRAWINGS

For a more complete understanding of the present invention, and the advantages thereof, reference is now made to the following descriptions taken in conjunction with the accompanying drawings, in which.

SUMMARY OF THE INVENTION

Figure 1A:
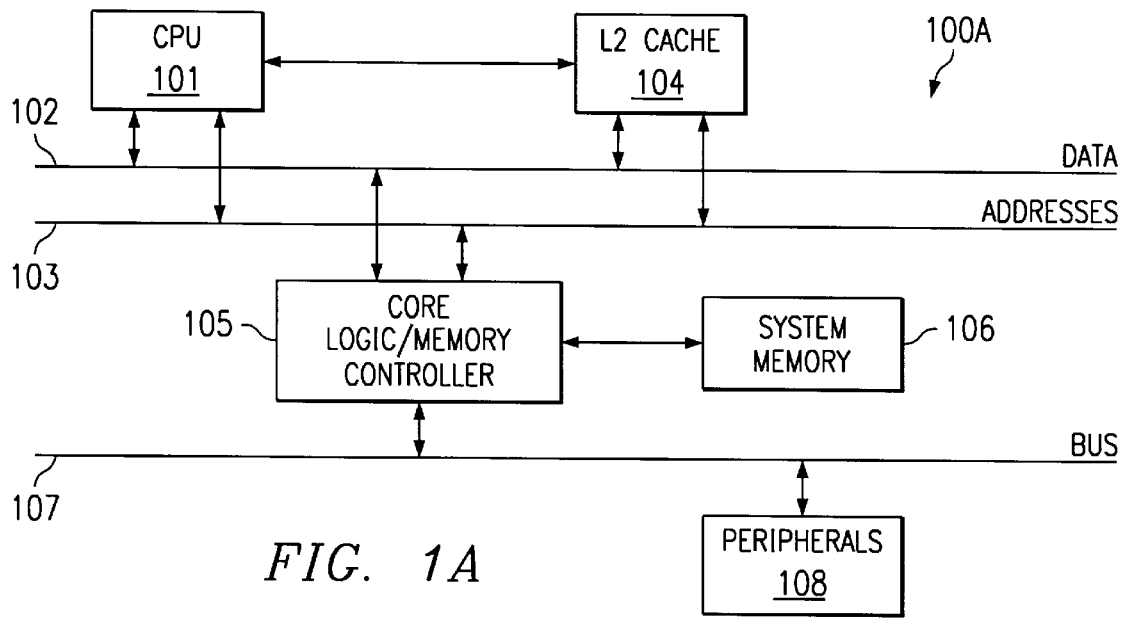
FIGS. 1A and 1B are block diagrams respectively depicting two basic system architectures A and 100B typical of those found in personal computers (PCs)

According to a first embodiment of the principles of the present invention, a memory is fabricated as a single integrated circuit device, the memory including an array of memory cells and accessing circuitry for accessing selected memory cells of the array. At least one local ALU is provided for receiving data accessed from selected cells in the array and performing a selected operation thereon.

According to a second embodiment of the principles of the present invention, a memory subsystem is disclosed which includes an array of dynamic random access memory cells and an array of static random access memory cells. The memory subsystem also includes circuitry for accessing a cell of a selected one of the arrays in response to a received address bit. An arithmetic logic unit is provided for receiving data from the accessed cell and selectively performing an operation thereon.

According to a further embodiment of the principles of the present invention, a memory is disclosed which includes an array of dynamic random access memory cells, an operand register for storing a received operand for selective use in an arithmetic logic operation, and a results register for storing a result from an arithmetic logic operation. An arithmetic logic unit is included for selectively performing an operation on data retrieved from said array of dynamic random access memory cells and an operand retrieved from the operand register, a result of the operation output by the arithmetic logic unit for selective storage in the result register.

The principles of the present invention are also embodied in methods of memory operation. According to one such embodiment, a method is disclosed for operating a single chip memory including an array of dynamic random access memory cells, an array of static random access memory cells, circuitry for accessing storage location of a selected one of the arrays, and an arithmetic logic unit. One of the dynamic and static random cell arrays is selected for access in response to a received address bit. A location in selected one of the memory arrays is accessed and an arithmetic logic operation is performed on data from the accessed location using the arithmetic logic unit.

The principles of the present invention are also embodied in a memory system including first and second ports for exchanging data with an external device and first and second data buses coupled to the first and second ports. The memory further includes at least one bank including an array of dynamic random access memory cells, a first static random access memory array for selectively exchanging data between the first data bus and the dynamic memory array, a second static random access memory array for selectively exchanging data between the second bus and the dynamic memory array, and circuitry for accessing said dynamic and static arrays. The circuitry for accessing compares a received address bit with a stored address bit and accesses a selected one of the arrays in response.

Principles of the present invention have substantial advantages over the prior art. Among other things, the ability to do arithmetic logic operations within the memory subsystem or chip allows for a substantial reduction in system processor overhead. The dual data port embodiment allows for simultaneously accessing the dual SRAM registers in a given memory bank, which is substantially advantageous in multiprocessing environments. Additionally, memories embodying the principles of the present invention would be particularly useful in reduced instruction set computing (RISC), which is memory intensive therefore requires efficient memory accessing.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1B:
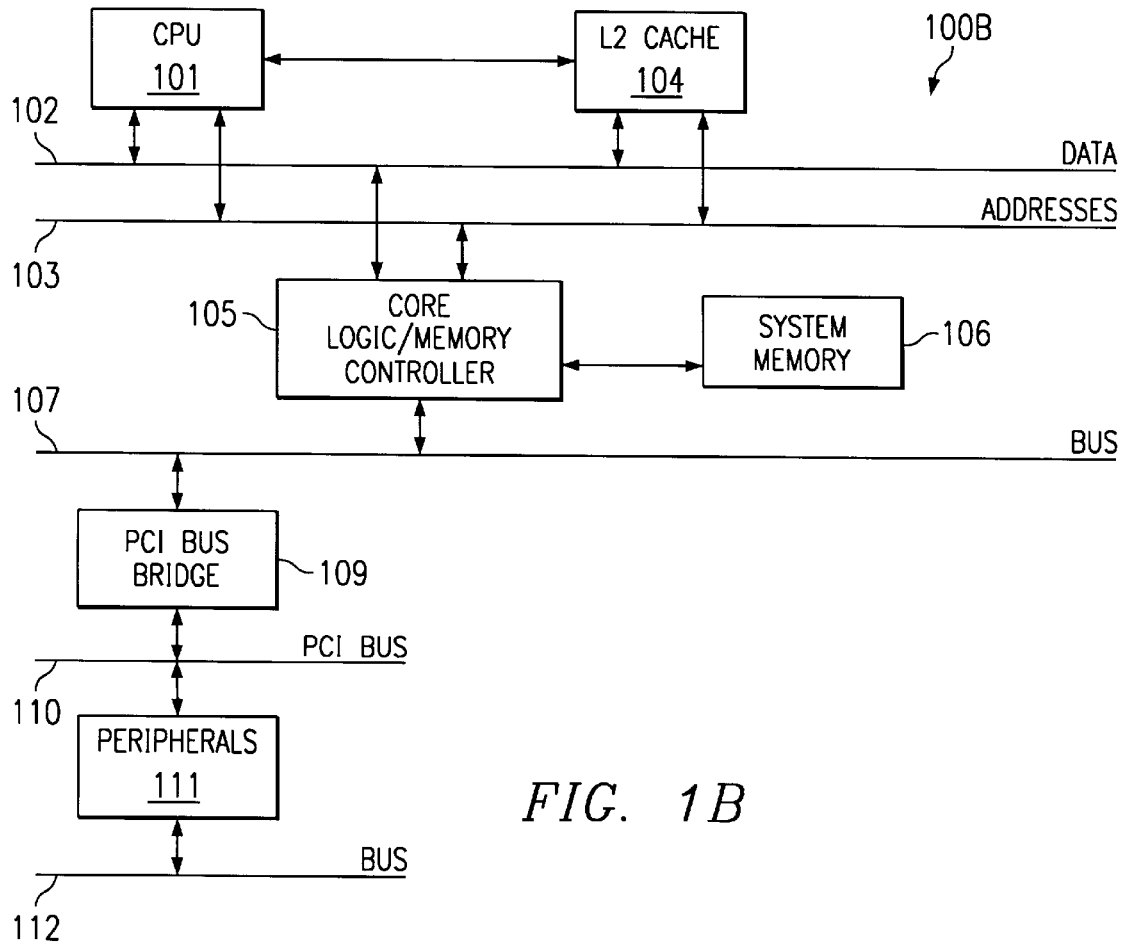

FIGS. 1A and 1B are block diagrams respectively depicting two basic system architectures 100A and 100B typical of those found in personal computers (PCs). While numerous variations on these basic architectures exist, FIGS. 1A and 1B are suitable for describing the basic structure and operation of most PCs.

Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium class microprocessor, a reduced instruction set computer (RISC), such as a Apple PowerPC microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as /RAS, /CAS, R/W and bank select, and monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache memory, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

The principles of the present invention may also be embodied in multiprocessing devices and systems. Although a number multiprocessing architectures exist to which the principles of the present invention can be applied, FIGS. 2A, 2B and 2C respectively depict exemplary multiprocessor architectures 200A, 200B and 200C for discussion purposes.

Multiprocessing system 200A is based upon n number of CPUs 201. Each CPU 201 is associated with a dedicated cache 202 and dedicated (private) system memory 203. Common bus 204 allows a given CPU to exchange information with peripherals, including mass storage subsystems 204, such as disk drives, tape drives and cartridge units, and Input/Output subsystems 206, such as printers, displays and keyboards.

The memory organization of system 200A is typically categorized under the "no read/write memory access" (NORMA) paradigm. In NORMA based systems, the processors have no access to a common memory and all data sharing between processors occurs over communications links. NORMA typically is used in fully distributed systems.

System 200B also primarily includes n number of CPUs 201, each with an associated cache 202, and coupled to the peripheral devices through a common bus 204. In the case of system 200B, system memory 207 is also coupled to bus 204 and is shared by all the CPUs 201. A second bus 208 is provided as a second path for accessing system memory 207.

The memory architecture of system 200B is typically designated as a unified memory access (UMA) architecture. Under the UMA paradigm, all processors have equal access to system memory and all processors have local cache. The unified memory access architecture typically provides the fastest possible interaction between processors and is the common architecture used in PCs, work stations, and other desktop computing devices. UMA based systems are often referred to as "symmetric-multiprocessing" systems.

System 200C is a system in which both private and system memory are provided. Specifically, in addition to dedicated cache 202, each CPU 201 is also associated with private memory 209. Each CPU is further connected by bus 204 to a shared system memory 210.

The memory architecture of system 200C falls under the non-uniform memory access (NUMA) paradigm. Under the NUMA paradigm, each processor has a private memory and additionally shares system memory with the other processors in the system. One difficulty in a NUMA based system is the fact that the access times for the private and system memories may be different creating timing problems.

Figure 2A:
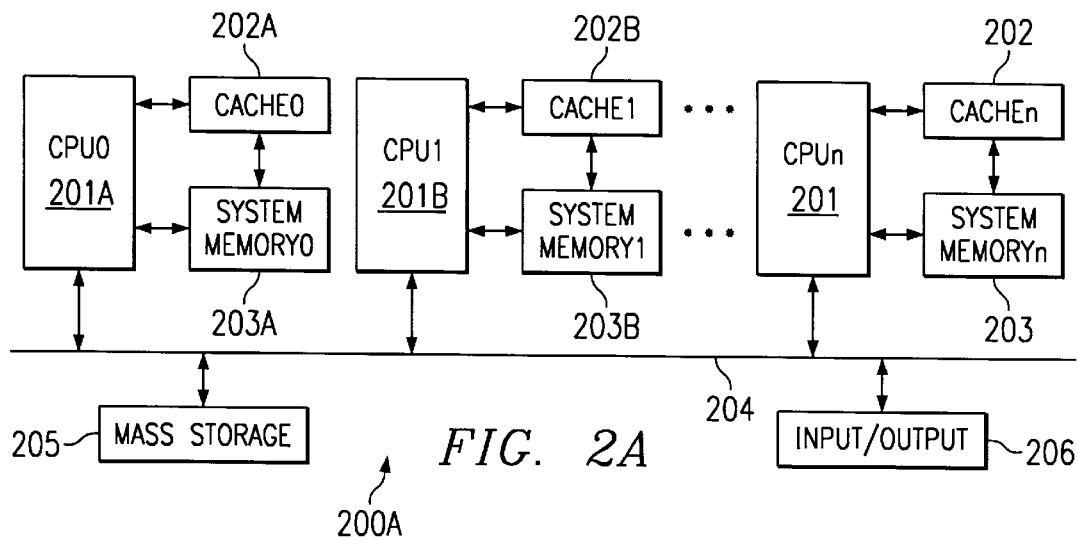
FIG. 2A depicts a multiprocessing system in which each processor operates in conjunction with private system memory.
Figure 2B:
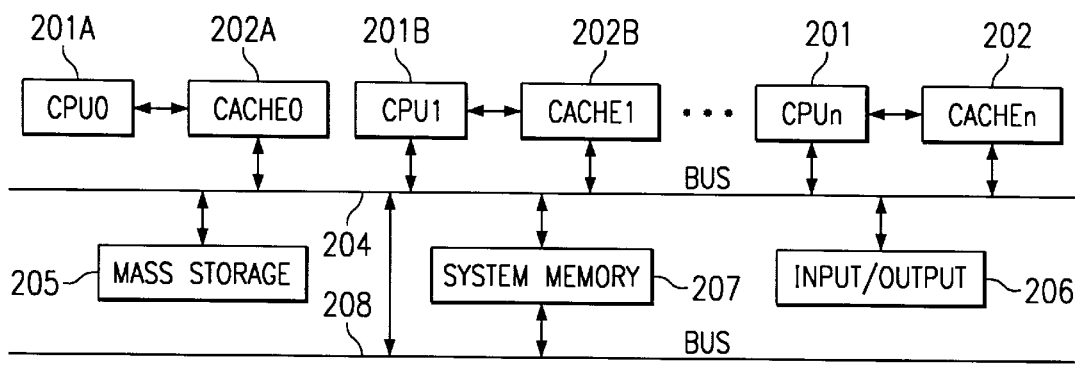
FIG. 2B depicts a multiprocessing system in which each processor operates in conjunction with a public system memory.
Figure 2C:
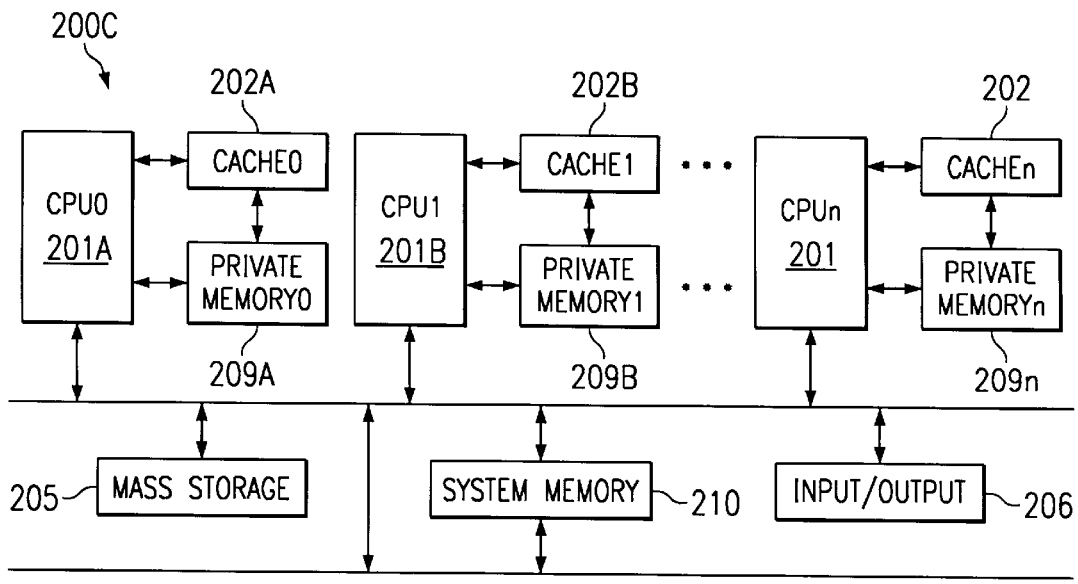
FIG. 2C depicts a multiprocessing system in which each processor operates in conjunction with both private memory and public system memory.

At the highest system level, there are a number of ways to implement the hardware architectures shown in FIGS. 2A, 2B and 2C in a complete hardware/software system. Three such systems are shown in FIGS. 3A–3C, respectively.

Figure 3A:
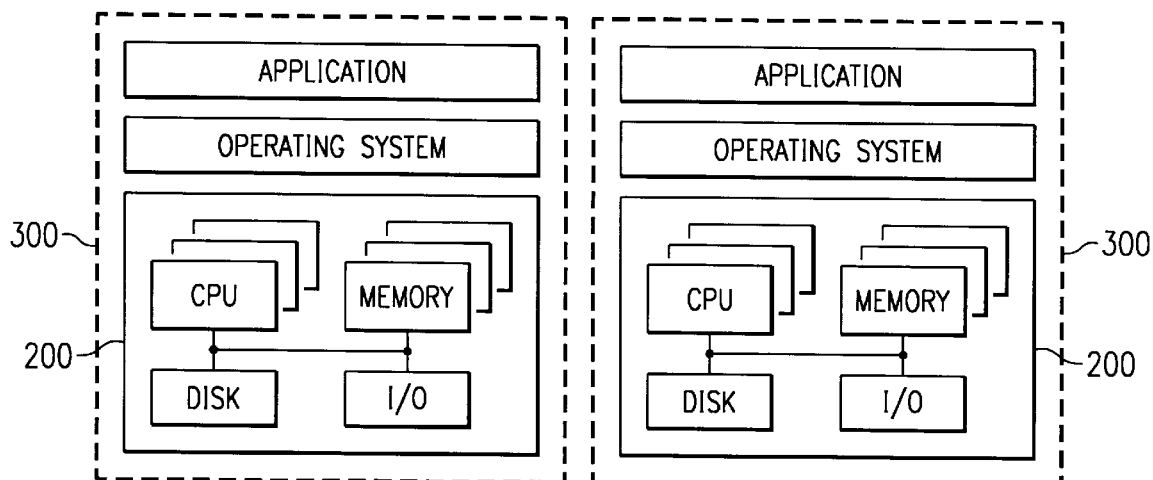
FIG. 3A is a diagram illustrating a "loosely coupled" multiprocessing architecture in which each processing node maintains a dedicated copy of the operating system and a dedicated copy of the applications program.

FIG. 3A is a diagram illustrating a "loosely coupled" multiprocessing architecture. In the loosely coupled architecture, each processing node 300 maintains a dedicated copy of both the operating system and the application programs. Loosely coupled architectures, such as that shown in FIG. 3A, are used often in embedded systems and in real-time systems in which tasks must be partitioned to different processing nodes for synchronization purposes. Embedded systems include those in which the CPU is fabricated on the same chip as logic, memory, a signal processor, or the like. High speed interconnects are used to share data and pass messages between processing nodes 300. While loosely coupled systems are more fault and error tolerant, their software programming is most often highly complex.

Figure 3B:
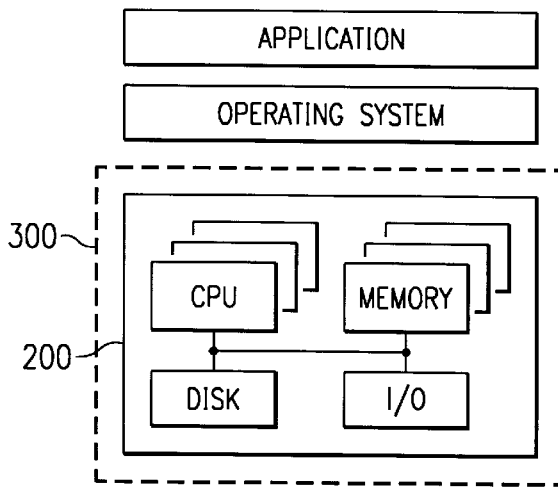
FIG. 3B depicts a "tightly coupled" multiprocessing system in which all processing nodes share a single copy of the operating system and a single copy of the applications program.

FIG. 3B depicts a "tightly coupled" system. In this case, a single copy of the operating system and a single copy of the application program are shared and executed by a single set of processors. Advantageously, writing software programs for a tightly coupled system is normally simpler than for writing programs to a loosely coupled system. However, tightly coupled systems, based only on single copies of the application programs and operating system, are less tolerant to errors and failures than the loosely coupled systems.

Figure 3C:
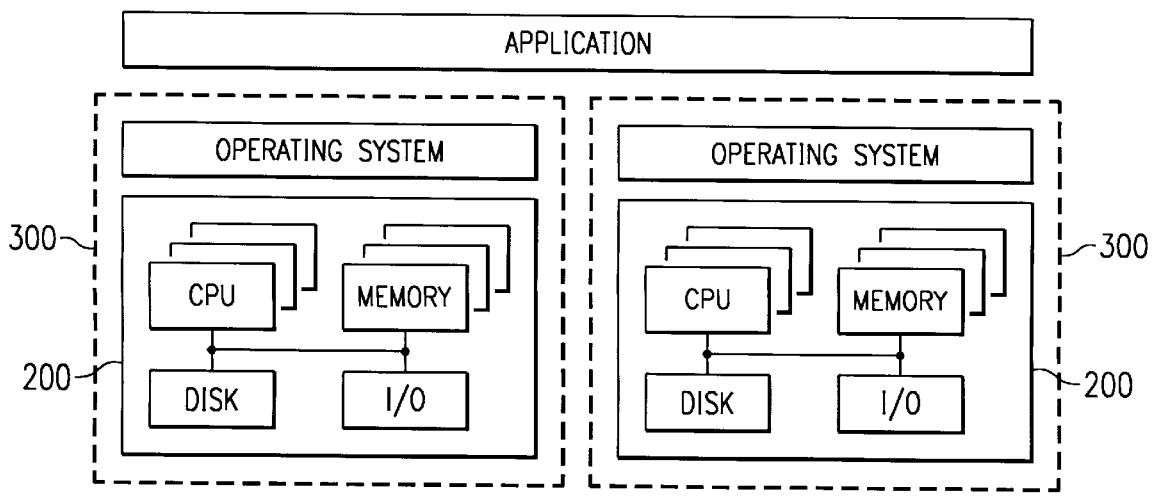
FIG. 3C is a diagram of a "snugly coupled" multiprocessing system in which each processing node maintains a dedicated copy of the operating system and all nodes share a single copy of the applications program.

FIG. 3C is a diagram of a "snugly coupled" system in which each processing node 300 maintains a dedicated copy of the operating system and all nodes share a single copy of the applications program. The snugly coupled variation is a hybrid which provides the tolerance to failure/errors found in loosely coupled systems while still providing the simpler program found in tightly coupled systems.

Generally, under any of the UMA, NUMA or NORMA paradigms, the system will act differently depending upon the type of processor employed. For example, a CISC CPU may be "latency" dominated while a digital signal processor (DSP) based system may be "dataflow" dominated. Further, pipelined processing algorithms typically are dataflow intensive, since the processors perform operations on streams of data received from other processors in the system and then pass the results on to other processors.

There are major challenges which must be addressed in the design of almost any multiprocessing system. First, if an architecture, such as those used in system 200B or system 200C, in which a single system memory system is shared by multiple processors, the issue of memory contention must be addressed; a technique must be developed to handle the situation in which several processors attempt to simultaneously access the shared memory. This problem is compounded by the fact that the contention issues must be dealt with from design to design, since different processors interface with memory differently. For example, a RISC processor requires substantial memory space while a CISC processor requires substantial register space.

In a memory device or subsystem with a single data input/output port and a single address port, contention problems can be solved by "memory locking." In this case, while one CPU (or controller) is accessing a given memory device or subsystem, the other CPU (controller) is "locked out" and cannot access that same device/subsystem. Memory locking is a memory management task which may be performed by the memory management unit (MMU) on-board the CPUs themselves or by a stand-alone device or subsystem. In any event, memory locking reduces the efficiency which multiprocessing was intended to increase, since during a contention situation, at least one processor must wait to access data.

Another major challenge is the software design. Symmetric multiprocessing operating systems are preferred, since this type of operating system is capable of seamlessly passing application programs to the CPUs as they become available. As discussed above, the selection of between tightly, loosely and snugly coupled software architecture requires substantial trade-offs, and in particular trade offs between ease of programming and fault/error tolerance.

Further, when multiple processors (or controllers) are coupled to the same bus, bus contention problems may also arise. Specifically, when a shared bus is employed, only one processor is normally granted access to the bus to perform a given bus task, while the remainder of the processors coupled to that bus must wait until their priority has been reached. One technique for minimizing bus contention problems, is to provide a dedicated cache for each CPU, as shown in FIGS. 3A–3C, so that a given CPU need only access the bus at times when required data are not found in the dedicated cache. As a result, cache coherency is a major concern in the design of a multiprocessing system. In other words, when a given processor modifies a location in memory, some technique must be provided for insuring that the data is modified in the cache memory of each of the other processors using the same data.

Figure 4:
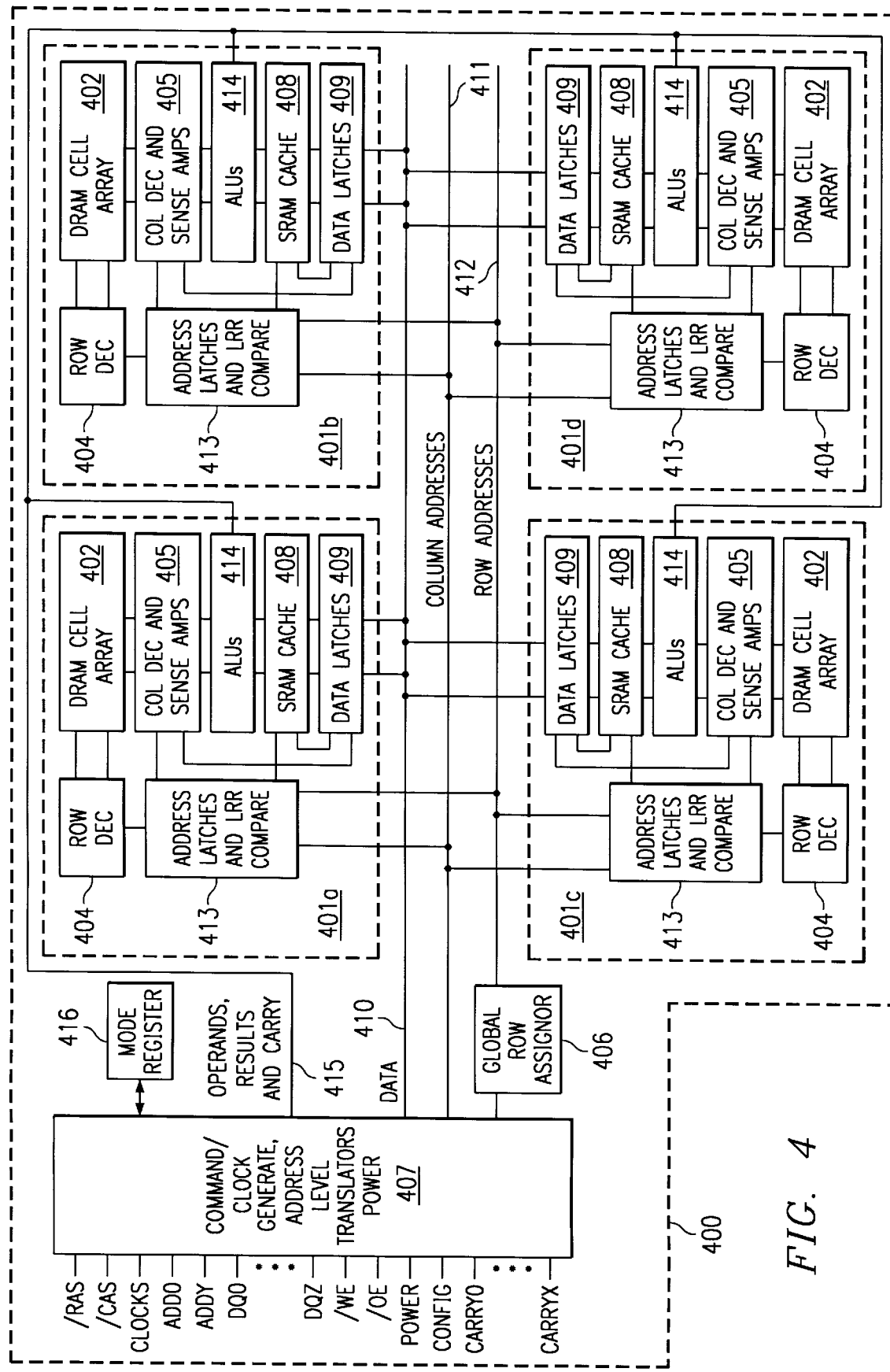
FIG. 4 is a functional block diagram of a dynamic random access memory device according to one embodiment of the principles of the present invention.

FIG. 4 is a functional block diagram of a dynamic random access memory device 400 according to one embodiment of the principles of the present invention. Memory 400 includes N number of memory banks or units 401, with four such banks 401a, 401b, 401c, and 401d being shown in FIG. 4 for discussion; the actual number of banks will vary from application to application, although N is preferably an even number two or greater. Banks 401 communicate with external circuitry through control and configuration circuitry 407, discussed further below. In single CPU processing systems, such as systems 100a and 100b, memory subsystem 400 may be used to construct system memory 102, although many other applications in the single CPU personal computer environment are possible, such as in the display frame buffer. In multiprocessing architectures, such as systems 200a, 200b, and 200c, memory subsystem 400 can be used to construct either the system memories or the local (private) memories. Preferably, subsystem 400 is a monolithic integrated circuit device.

Each bank 401 includes an array 402 of dynamic random access memory (DRAM) cells arranged in N number rows and M number columns. As is known to those skilled in the art, each array 402 may be partitioned into multiple subarrays, with the columns organized using either an open-bitline or folded-bitline approach. Each bank 401 further includes a traditional DRAM row decoder 404 coupled to the array wordlines, and traditional DRAM sense amplifiers/column decoder circuitry 405 coupled to the array bitlines. The row and column decoders are preferably organized in hierarchical fashion in which a main decoder and one or more levels of subdecoders/drivers are used. Generally, each row decoder 404, in response to a row address, selects one of N rows for access during an active cycle when the row address strobe /RAS is in a logic low state. Column decoder selects P number of pages (locations) of C number of columns (bits) from the M total number of columns in response to P number of column addresses for access during an active cycle.

Global row assignor 406 performs a "coarse granularity decoding" using L number of least significant row address bits from each received row address. Specifically, all banks 401 are active during each /RAS cycle, and global row assignor using the L least significant row address bits to select. Row decoders 404 consequently decode the Y−1 number of remaining most significant address bits to simultaneously select one row per /RAS cycle in each DRAM array during a DRAM access.

Control circuitry 407 receives conventional DRAM control signals and clocks from an external source, such as processor 101 or core logic 105 in system 100 or CPUs 201 in multiprocessing systems 200A–200C. These signals include a synchronous clock (SCLK), a row address strobe (/RAS), a column address strobe (/CAS), read/write select (R/W) and output enable (/OE), along with data (DQ) and addresses ($A_{dd}$). Control circuitry 407 also inputs a configuration bit (CONFIG), discussed below. In the preferred embodiment, the address input port is multiplexed in a conventional manner wherein row addresses and column addresses are received sequentially at the same pins and latched in with /RAS and /CAS respectively.

Each bank 401 further includes static random access memory (SRAM)/SRAM column decoder circuitry 408. SRAM circuitry 408 will be discussed in further detail in conjunction with FIG. 6, but can generally be described at this point as follows. First, a linear array of M number of DRAM cells is included for storing a row of data transferred from the corresponding DRAM array 402. Second, SRAM column decoder circuitry is included for page access (reads or writes) of C-bit wide pages of data to the row of data in SRAM array in response to one or more column addresses.

Data latches 409 interface the DRAM sense amplifiers/column decoders 405 and the SRAM column decoders 408 with a data bus 410. Column addresses are transferred via a column address bus 411 and row addresses by a row address bus 412.

Address latches and last row read (LRR) compare circuitry 413 includes latches for storing the current row and column addresses received at the address port $A_{dd}0$–$A_{dd}Y$. Also included as part of circuitry 413 are latches for storing the high order (MSB) row address bits of the last row read (LRR) and comparison circuitry for comparing the stored LRR bits to the high order bits (MSB) of the current row address.

It should be noted that while in the illustrated embodiment the least significant row address bits are processed by global assignor 406 and the most significant row address bits are used internal to the banks 401 to select individual rows of cells, other arrangements will just as easily apply. For example, a given number of most significant row address bits could be used by global row assignor 406 and the remaining least significant bits used for individual row select. Further, either big- or little-endian data structures can be used. The number of address bits presented to the SRAM cache of a given bank 408 is identical to the number of MSB address bits presented to DRAM row decoder 404.

According to the principles of the present invention, each bank 401 includes a set of arithmetic-logic units (ALUs) 414 coupled to its SRAM cache 408 and its DRAM decoders/sense amplifiers 405. Under the control of bits written into mode register 416, ALUs 414 of one or more banks 401 can operate on bits output from either the SRAM cache 408 or DRAM column decoder/sense amplifiers 405 of the given bank or banks 401. The available operation include AND, OR, NOR, NAND, INVERT, SHIFT, ADD and SUBTRACT. The operations (except SHIFT and INVERT) are performed using data retrieved from bank-internal memory 402/409 and operands received through the data port (DQx) and presented on bus 415. The results and carry can then be output via bus 415 and the data port (DQx) and the carry port (CARRYx) on the following cycle. The operation performed for a given ALU cycle or cycles is selected by writing operation select bits into mode register 416.

Figure 5:
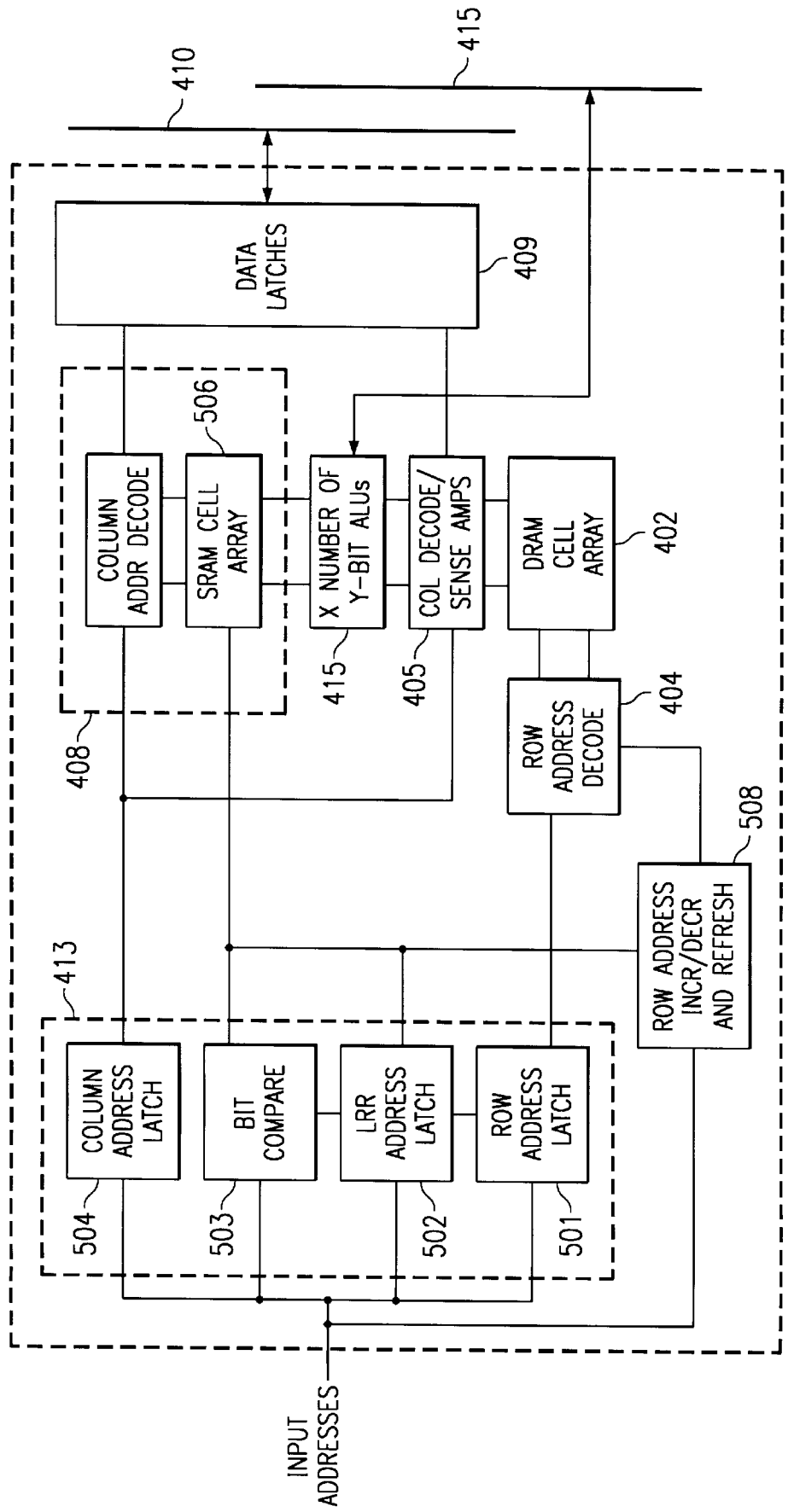
FIG. 5 is a more detailed diagram emphasizing the data and address routing circuitry memory arrays, and arithmetic logic units of the selected bank memory shown in FIG. 4.

FIG. 5 is a more detailed diagram emphasizing the data and address routing circuitry of a selected bank 401. Addresses are received in a multiplexed fashion at the address port Add0–AddY. The row address bits are latched on the falling edge of /RAS (which follows the SCLK) into row address latch 501. The most significant bits are presented to the fine granularity row decoders 404 and the least significant bits to the global row assignor 406. The most significant row address bits from the previous (last) /RAS cycle are transferred to last row read address latch 502. Comparison circuitry 503 compares the most significant row address bits latched into row address latch 501 and the last read row address held in latch 502. During each /CAS cycle, one or more column addresses are received at address port Add0–AddY and latched into column address latch 504 with each falling edge of /CAS.

SRAM registers (SRAM array) 506 store data associated with the address bits stored in last read address latch 502 (i.e., assuming that row addresses and data are considered together as a data structure, the row address MSBs comprise the row field and the data bits, the data field). Row address increment/decrement and refresh control circuitry 508, when enabled, steps through the rows of array 402 to perform cell refresh through the DRAM sense amps and implements the address transformations detailed below.

Figure 6:
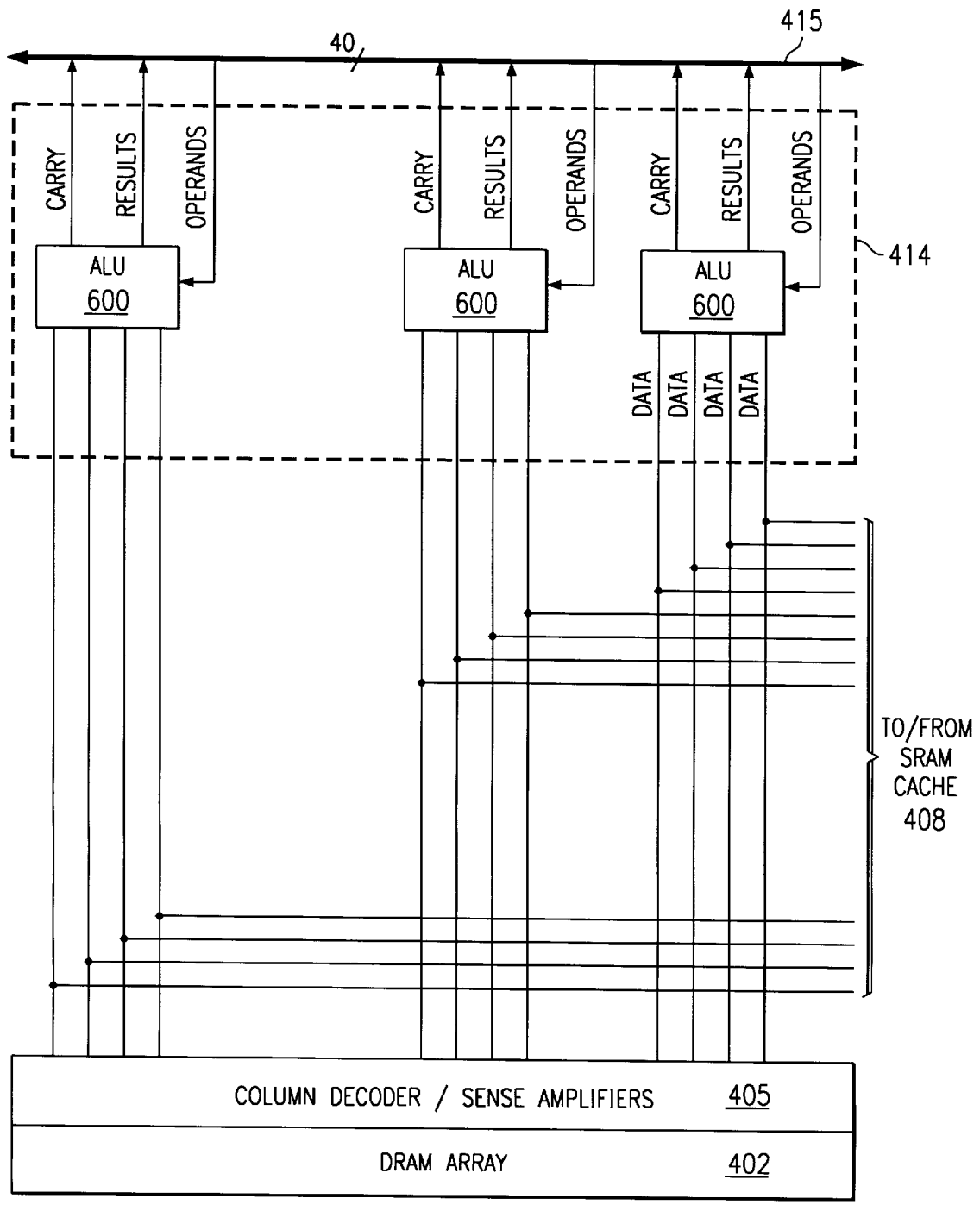
FIG. 6 is a more detailed block diagram emphasizing the arithmetic logic units shown in FIG. 5 and their connection to the memory arrays.

As shown in FIG. 5, ALUs 414 comprise X number of individual Y-bit ALUs, where Y=n/x (n being the number of columns in arrays 402/506). FIG. 6 emphasizes the individual ALUs 600. In the illustrated embodiment, each ALU 600 is a 4-bit device, receiving 4 bits from 4 columns of DRAM array 403 and 4 operand bits from bus 415. Following the selected operation, each ALU 600 outputs 4 result bits and 1 carry bit, with the exception of a SHIFT. In the case of shift operations, the overflow bit from a shift (either direction), for each individual ALU 600 or a cascaded set of ALUs 600, may be wrapped-around.

For a DRAM array of 1024 columns, 256 4-bit ALUs would typically be provided. It should be noted that while Y, the bitwidth of each ALU 600 can vary, the selection of a 4-bit ALU is advantageous since current chip fabrication techniques will easily allow a 4-bit ALU to fit within a 4-column pitch.

In the illustrated embodiment, bus 415 is 40 bits wide, with 32 lines for input of operands and output of results and 8 lines for carry bits. Thus, per a given ALU operational cycle (as will be discussed further below, in the illustrated embodiment, an ALU operation cycle, including input and output, consumes there /RAS cycles) 32 bits are processed by 8 ALUs 600. The 8 ALUs are selected as a function of the column address, in this example each column address also accesses 32 bits of data through column decoders/sense amplifiers 405.

Typical read/write accesses to memory 400 will first be discussed, followed by a more detailed discussion of performing data manipulations on data retrieved from one or more of DRAM arrays 402.

During an access, a row address is first received at address pins Add0–AddY. On the falling edge of /RAS, the least significant row address bits (in the four bank embodiment, the two least significant bits) are passed to global row assignor 406 and the remaining most significant bits are latched into row address latch 501 of each bank 401. The most significant bits stored in each row address latch 501 from the previous /RAS cycle are transferred into the corresponding LRR address latch 502.

In a first method of reading, the bit CONFIG at the input to memory 400 is set to a logic low. Global row assignor 406 determines from the current least significant row address bits the bank 401 which corresponds to the address space of the received address. The comparator 503 of the corresponding bank 401 is enabled such that during the period between the falling edge of /RAS and the first high to low transition of /CAS, that comparator 503 compares the current address most significant bits in the corresponding row address latch 501 and bits stored in LRR address latch 502. If a match occurs for the given bank, the SRAM column address decoders 507 are selected and set-up to access the complete SRAM cell array 506 of that bank. Column addresses received at the address port Add0–AddY are latched into column address latches 504 of each bank and each SRAM column decoder 507 accordingly allows access to a C-bit word per each of P number of column addresses latched-in with /CAS. The accesses are implemented through a C-bit wide data bus 410; if for example, each bank is organized as a by 16 device, data bus 410 is 16-bits wide and so on. Preferably, the selected (enabled) bank is the only bank 401 accessed via data bus 410, the word of data in the data latches 409 of the other banks is simply not used.

If the address bits in latches 501 and 502 do not match for the bank 401 addressed by the received row address LSBs, access must be made to the corresponding DRAM array. Specifically, for a read to the addressed bank 401, the row is selected by DRAM row decoder 404 from the corresponding DRAM array 402 and an entire row of data transferred to the associated SRAM array 506 for output when the column addresses are presented. For the remaining banks 401, the MSBs are incremented or decremented using the corresponding row address increment circuitry 508. A row of data for these banks is similarly transferred to the corresponding SRAM arrays 507.

Assume for example, in the illustrated four bank system, that the received row address has LSBs 01 indicating the address space of bank 401b (Bank1) is to be accessed. Global row assignor 406 hence enables Bank1 to make the comparison of the row current address MSBs and the bits stored in the Bank1 LRR latch. The row address MSBs as received are not modified for transferring data from the bank 401b DRAM array 402 to the Bank1 SRAM array. However, for bank 401a (Bank0) the row address MSBs are decremented by 01 by the corresponding row increment circuitry 508 and the row address MSBs for banks 401c (Bank2) and 401d (Bank3) are incremented by 01 and 10 respectively. In other words, if the address to Bank1 (the received row address MSBs) is designated address A+1, then address A+1 is decremented by one such that Bank0 receives address A0 and incremented such that Bank2 receives address A+2 and Bank3 receives address A+3. These addresses are used to access the associated bank's DRAM array 402 and the accessed data in DRAM transferred to the SRAM arrays. The new addresses are stored in address latches 501.

During accessing of the addressed bank, assuming again for discussion purposes BANK1, the DRAM of any bank, including in this case the DRAM array 402 of Bank1 can be refreshed. The DRAM column decoders 405 isolate the corresponding DRAM arrays 402 from the SRAM arrays 408. Thus, while data is being accessed from the SRAM array of the selected bank 401, any or all of the DRAM arrays 402 can be refreshed without disturbing the data in the SRAM arrays. Refresh is preferably performed by incrementing the row addresses in each bank using increment and refresh circuitry 508 and latching each row of data using the DRAM sense amplifiers 405 in a conventional fashion.

In the preferred embodiment, once the data in the SRAM array 506 of the addressed (selected) bank has been accessed, the /RAS cycle is complete. The data in the SRAM arrays 506 of the remaining banks 401 is available through the associated data latches 409, and could be used, but typically is reserved for future /RAS cycles. The current row address MSBs for the selected banks and the new row address MSBs are transferred to the LRR registers during the next /RAS cycle. The corresponding data remain in the SRAM arrays. Advantageously, since the CPU and/or operating system typically accesses data within temporally or spatially adjacent areas in memory, the probability is substantial that a match will occur.

For a write the following is the preferred method. An address is received at address port Add0–AddY. From the LSBs, global row assignor 406 determines the bank 401 assigned to the corresponding row address space. Assume again for example, the LSBs are 01, addressing bank 401b (Bank1). The received row MSBs are taken as the address to the Bank1 DRAM array 402. As was done above, the row address increment circuitry 508 for Bank0 decrements the received row MSBs to obtain a row address to the Bank0 DRAM array and increments the received MSBs by 01 and 10 to obtain row addresses to the DRAM arrays of Bank2 and Bank3 respectively. The MSB row address bits for each bank 401 is written into the bank's LRR register 502.

In a second method of accessing, the CONFIG bit at the input to memory 400 is set high. In this case, during an access, the MSBs of a received address are compared by all the comparators 503. If a match occurs in any one or more banks 401, the data from all the banks is taken, although the data from the non-matching banks may be discarded or left in the data latches.

Figure 7:
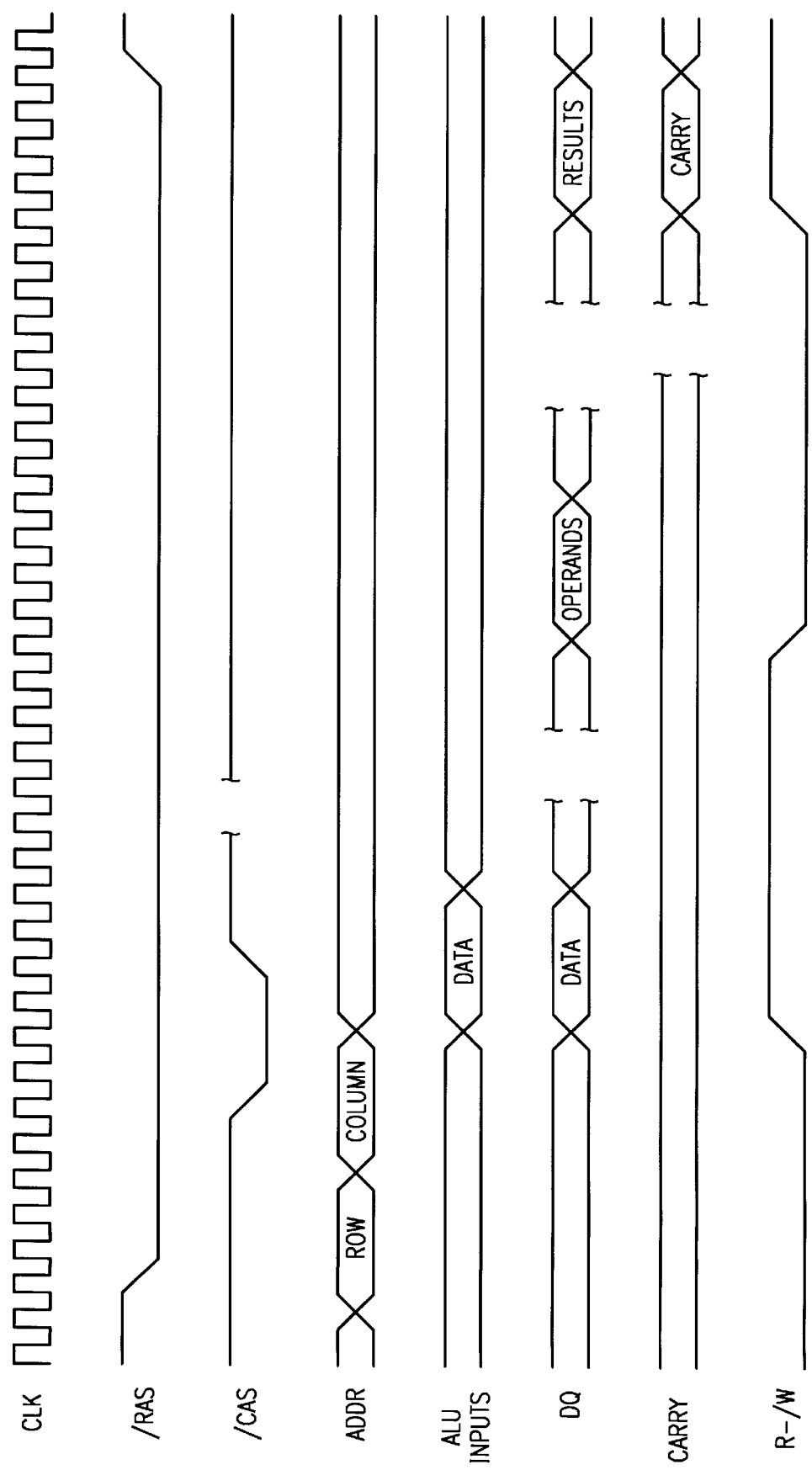
FIG. 7 is a timing diagram of a typical operation performed by the memory of FIG. 5.

FIG. 7 is a timing diagram illustrating a typical ALU cycle according to the principles of the present invention. In the illustrate embodiment, a synchronous DRAM is being assumed with all operations timed off a master or system clock CLK.

An ALU cycle begins on the falling edge of /RAS (or an activate signal) at which time a the low order row address are latched into the row address latch 501 of the bank selected by the high order row address bits and global row decoder 406. A comparison is again made between the stored last read row address and received low order. If a match occurs, the row address is used to access a row in SRAM cell array 506, otherwise a row in DRAM cell array 402 of the given bank is access.

On the falling edge of /CAS, a column address is latched in. This column address used to access a column along the address row, from either SRAM 506 or DRAM 402 depending on the results of the comparison. Additionally, this column address activates the ALUs 600 corresponding to the addressed columns.

The Read-/Write signal is set high, and after a /CAS latency of approximately 3 clock periods, data from the accessed SRAM or DRAM cell array is presented at the inputs to the active ALUs 600 as determined from the column address. This data also appears at the DQ port of device 400 where it can be used or discarded by external circuitry as required.

On the high to low transition of the Read-/Write signal, the operands for the forthcoming ALU operations are input through the DQ port and presented on bus 415. The ALU operation corresponding to the operation select bits within mode register 416 is then performed by the active ALUs 600 using the data from bank 401 internal SRAM or DRAM memory and the operands received on bus 415 (except in the case of a shift when the operands are not required). On the next rising edge of Read-/Write, the results and carry bits are output via bus 415 and the DQ and CARRY ports respectively.

It should be noted that alternatively, the results and/or carry bits from the ALU operation can be written back into either the SRAM array 506, the DRAM array 402, or both, of the given bank 401. In the illustrated embodiment, an additional /RAS cycle and truncating or rounding of the ALU outputs are required. Specifically, no additional cells along the addressed row, either in SRAM or DRAM, are provided for the additional carry bits. Therefore the output from each ALU is reduced by one bit. This can be done by discarding the carry bits, truncating the LSBs of the results and retaining the carry bits, rounding, or performing a similar operation.

The results/carry bits are stored in data latches 409 of the corresponding bank 401. A new /RAS cycle is initiated to precharge DRAM arrays 402 and/or input new row and column addresses. Depending on the addresses, these results/carry bits can be written, via data latches 409 and data bus 410, into the DRAM array 402, SRAM array 506, or both, of any bank 401.

Figure 8:
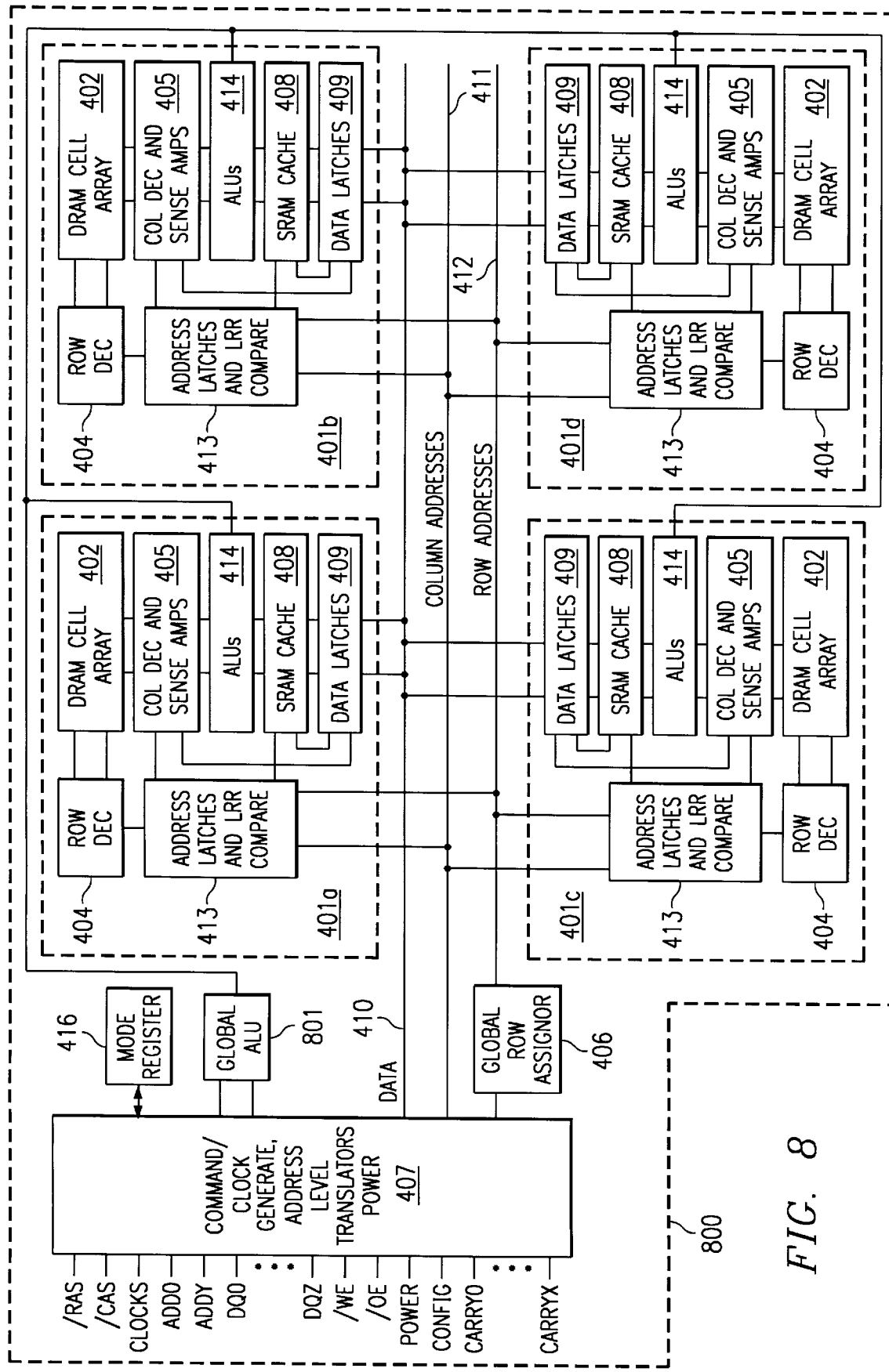
FIG. 8 is a diagram of a dynamic random access memory according to a second embodiment of the principles of the present invention.

FIG. 8 depicts an multibank memory system 800 in which a global ALU 801 has been added to the architecture shown in FIG. 4. Global ALU 801 allows results and/or carry bits presented on bus 415 to be further operated upon using one of the available operations: ADD, SUBTRACT, MULTIPLY, DIVIDE, AND, OR, NAND, NOR, INVERT OR SHIFT. Operation selection is in response to bits written into mode registers 416. For example, the output of a selected ALU 600 can be added to the output of one or more of the other active ALUs. Similarly, a logic operation or shift can be selectively performed on multiple ALU outputs on bus 415.

The results and carry bits can then be output, with or without truncating or rounding, through the DQ and CARRY ports. Preferably, the global ALU operations are performed during the same /RAS cycle during which the individual ALUs 600 present results/carry bits on bus 415, as pipelined by clock CLK.

Figure 9:
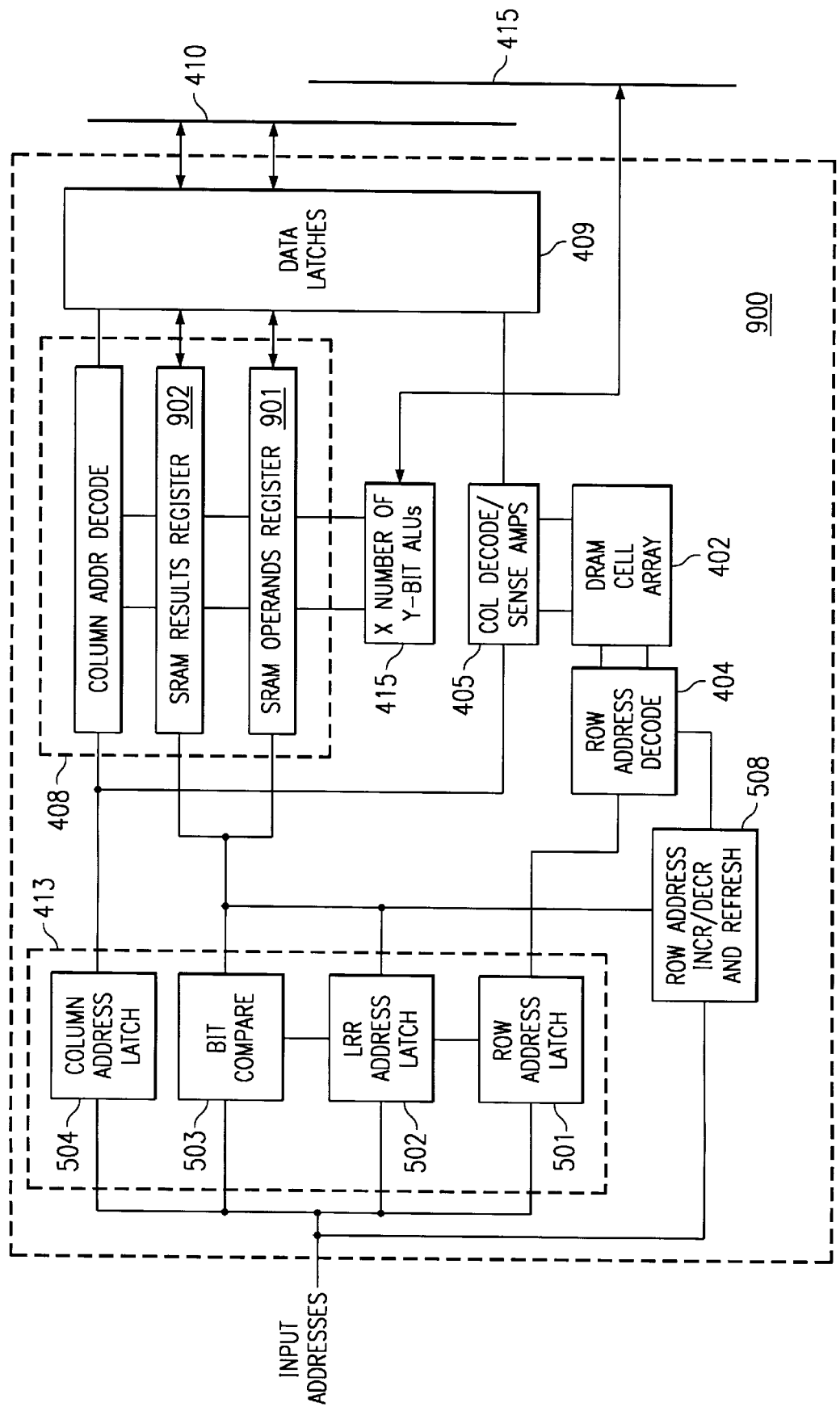
FIG. 9 is a more detailed diagram emphasizing the data and address routing, registers and arithmetic logic unit of an alternate SRAM cache unit according to the principles of the present invention.

FIG. 9 depicts a further embodiment of the principles of the present invention. In this embodiment, each cache 408 includes an SRAM operand register 901 and an SRAM results register 902. During an ALU cycle, incoming operands may be stored in register 901 and the results/carry bits (after truncation or rounding) following the ALU operation stored in register 902. Thus, the results operands and results from the last operation are locally available for processing. These results/carry and can be sent to the ALUs 600 on during the current ALU cycle, timed by CLK, to perform operations which do not require externally provided data, such as iterative arithmetic operations and the like.

The contents of registers 901 and 902 carry over to the next /RAS cycle (access cycle or ALU cycle), where they can be reused or discarded. In the simplest case, the data in registers 901 and 902 is overwritten by new operands and results, coming from either a new ALU operation, an external write to SRAM cache, or a copy from DRAM to SRAM cache.

Normally, after an ALU operation occurs, the address fields stored with the results and operands in register 901 and 902 are the same. As such a row address comparison made during a subsequent cycle may cause memory contention problems. To avoid this situation, the address fields stored in one or both of registers 901 and 902 may be rewritten through the address port and Row address latch 501 or by incrementation or decrementation of the stored address by row address increment/decrement circuitry 508. Moreover, the address field and data in one of the registers could simply be discarded, leaving a single address and data structure in SRAM cache.

If an additional /RAS cycle is used to precharge DRAM array 402, operands from register 901 and in particular, results from register 902, can be copied into the DRAM array 402 of the given bank. Advantageously, if the results are being retained for future access using the matching procedure described above, copying insures that the data in the DRAM array is up to date.

Figure 10:
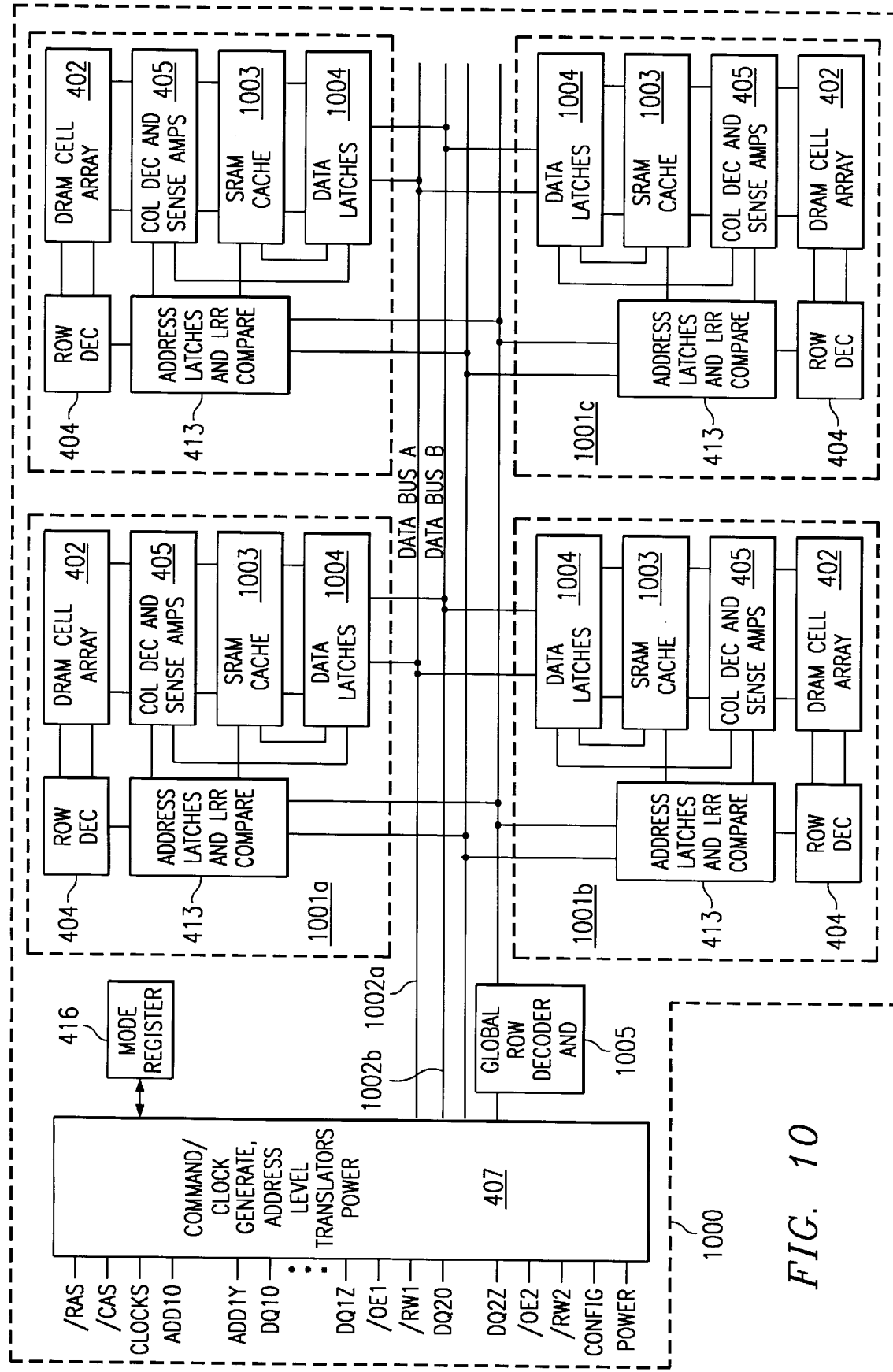
FIG. 10 is a diagram of a random access memory according to a third embodiment of the principles of the present invention.

FIG. 10 is a functional block diagram of a dual data port memory device 1000 according to the principles of the present invention. The first port includes data terminals DQ1o–DQ1z, an output enable terminal \OE1 and read-write control terminal \RW1. The second port includes data terminals DQ2o–DQ2z, an output enable terminal \OE2 and a read-write control terminal \RW2.

In this embodiment, each bank 1001 two internal data buses 1002a (BUS A) and 1002b (BUS B) are provided to independently access respective read and write registers in SRAM cache 1003. Accordingly, data latches 1004 are wider than the embodiments discussed above.

Figure 11:
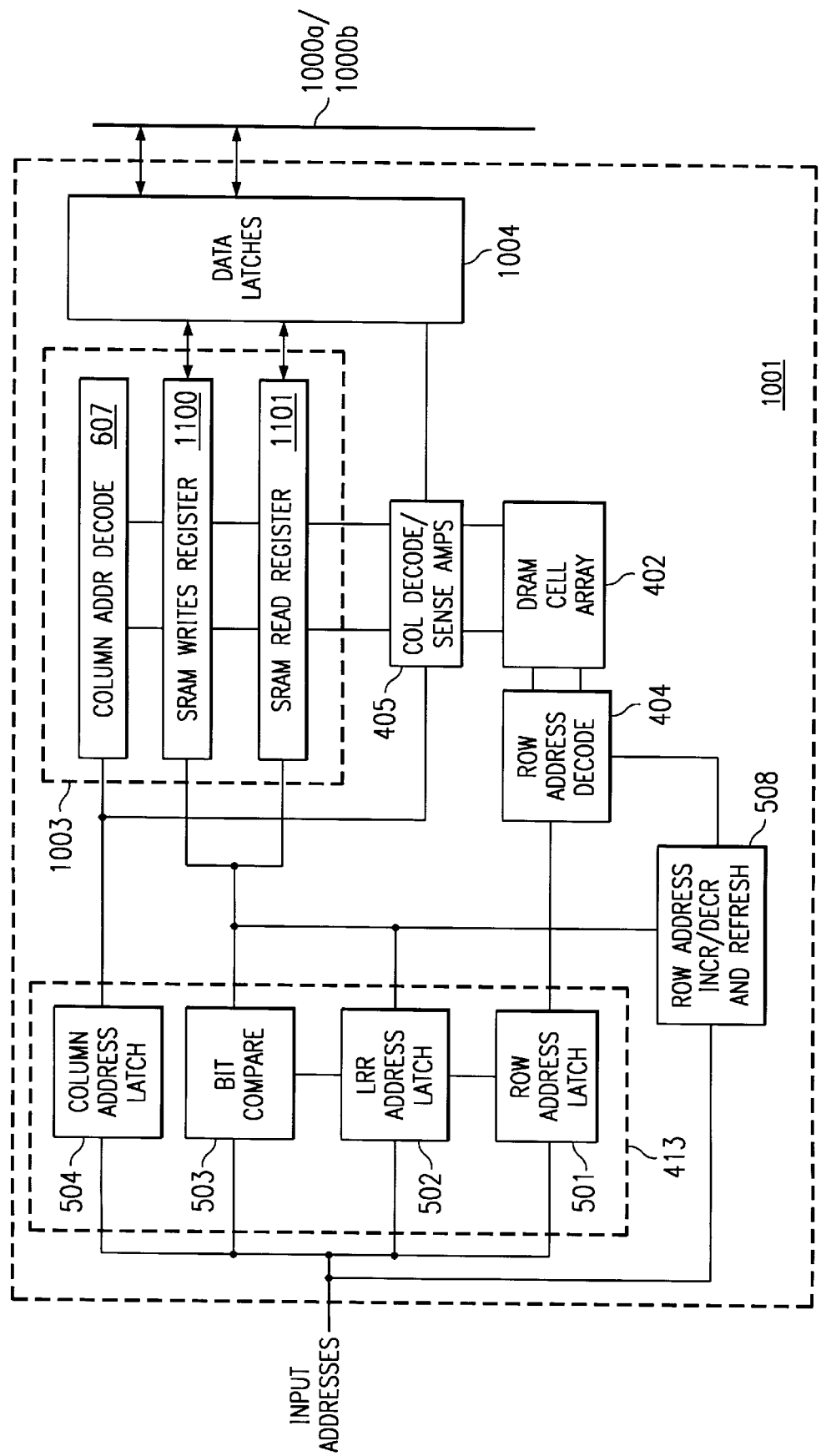
FIG. 11 is a more detailed diagram emphasizing the data and address routing and registers of a selected bank of the memory shown in FIG. 4.

FIG. 11 is a more detailed functional block diagram of the SRAM cache 1003 of a selected bank 400. Specifically, FIG. 11 depicts an embodiment where SRAM cache 1003 includes a write SRAM array (register) 1100 and a read SRAM array (register) 1101. SRAM registers 1100 and 1101 communicate with data buses 1001a and 1001b through data latches 1004.

According to the principles of the present invention, SRAM registers 1100 and 1101 of a given bank 1001 can be simultaneously accessed using the dual data ports and dual data buses 102, assuming a match has occurred between the received row address and the stored LRR bits stored in that bank. Further, if the drive of the SRAM write register is high enough, the write register data can be copied into the corresponding DRAM array without requiring an additional /RAS cycle for DRAM precharge.

Figure 12:
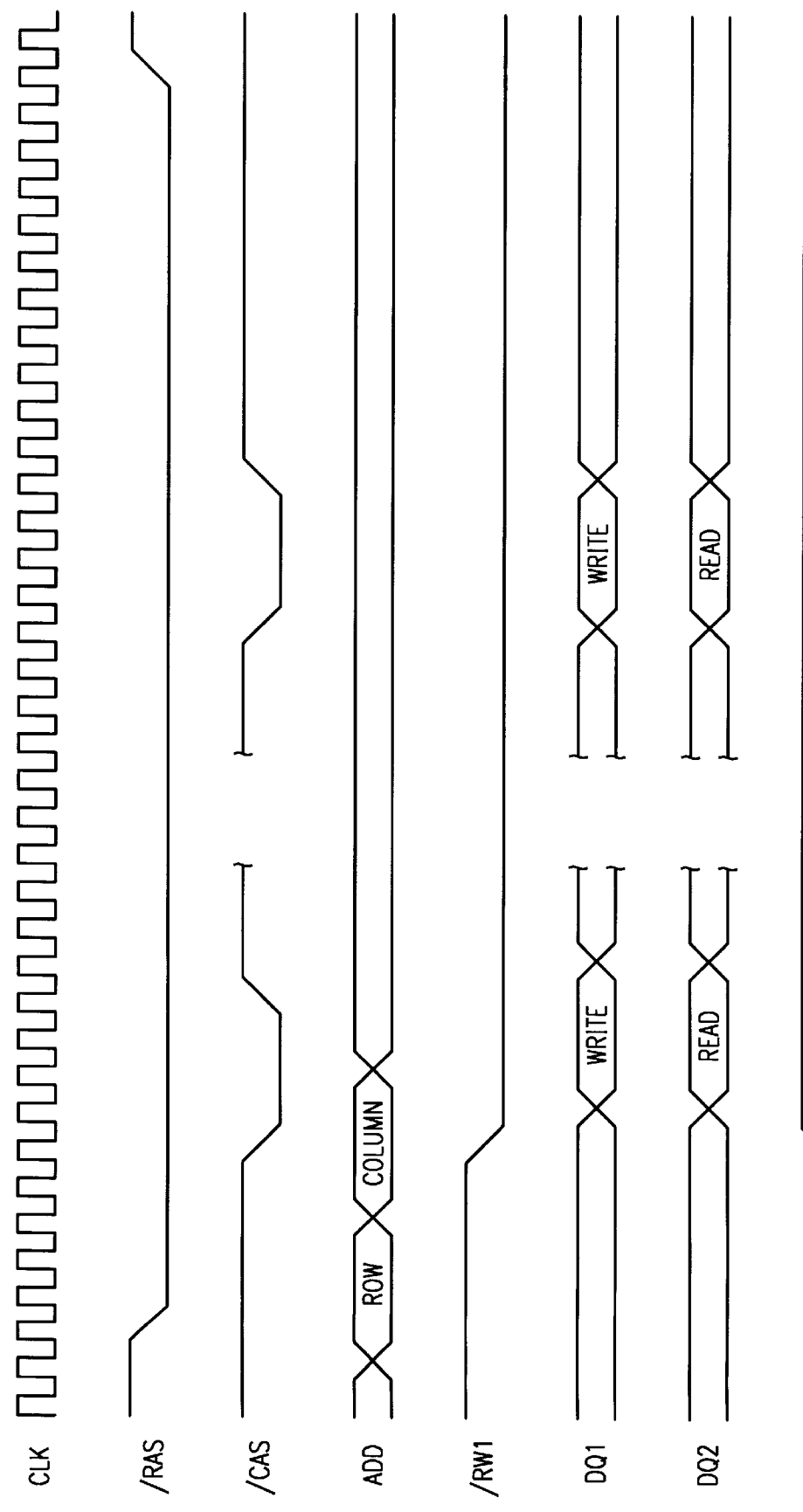
FIG. 12 is a timing diagram of a typical operation cycle of the memory shown in FIG. 11.

FIG. 12 is a timing diagram depicting a simultaneous access to write and read registers 1100 and 1001 of a selected bank 1001. In this example, a write is being performed to write register 1100 and a read is being performed to read register 1001. However, although these registers are labeled "read" and "write," it should be noted that simultaneous writes and simultaneous reads to both registers are also allowed operations.

In FIG. 12, a match has occurred between the incoming row address LSBs and the bits in LRR latches 502, thereby enabling access to SRAM registers 1100 and 1101. Global decoder selects the bank 1001 to be accessed using the received row address MSBs. (If a match had not occurred, then an access to the DRAM array 402 of the selected bank 1001 is performed as before. In this case, only one data (DQ) port and one data bus 1002 are used for the DRAM access). The row and initial column addresses are latched in with /RAS and /CAS respectively. Internal incrementation of the column address with each additional /CAS cycle is performed, as required to page data into the SRAM registers. Signal /RW2 is set low to write data through data port DQ1 via data bus 1002a to write register 1100 of the selected bank. Signal /RW2 is set high to read data from read register 1101 and output it through data port DQ2 via bus 1002b.

The data in write register 1100 can be copied into the addressed row in the corresponding DRAM array 402 without an additional /RAS cycle. Generally, by providing the SRAM cells of write register 1100 with sufficient drive, data from the write register can be written through the sense amplifiers and charge or discharge, notwithstanding the fact that the bitlines have not been precharged.

To update the data in read register 1101, a new /RAS cycle is required to transfer data from the corresponding DRAM array 402. In this case, no address matching would occur thereby initiating access to the DRAM array as described above.

Memories embodying the principles of the present invention have substantial advantages over the prior art. Among other things, by providing circuitry for performing arithmetic and logic operations within the memory, the processing overhead of the system processor or processors can be substantially reduced. Further, dual data port embodiments allow for the simultaneous accessing of a given memory bank, a feature which is particularly useful in multiprocessing environments. Additionally, embodiments of the present invention can advantageously be applied to reduced instruction set computing (RISC) systems which are normally memory intensive and therefore require particular efficient schemes of memory accessing.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A memory fabricated as a single integrated circuit chip comprising:
   an array of memory cells;
   accessing circuitry for accessing selected memory cells of said array;
   at least one local ALU for receiving data accessed from selected cells of said array and performing a selected operation thereon;
   a register comprising a plurality of memory cells and coupled to said plurality of ALUs; and
   second assessing circuitry for selectively accessing said cells of said register and presenting data accessed from selected ones of said cells to said plurality of ALUs wherein said second accessing circuitry compares a received address bit with a stored address bit and accesses said register when said received address bit matches said stored address bit.

2. The memory of claim 1 wherein each said ALU comprises an input for receiving an operand from a bus, said ALU performing said selected operation on said accessed data using said operand.

3. The memory of claim 1 wherein said at least one ALU comprises a plurality of parallel ALUs each for selectively operating on a portion of said accessed data.

4. The memory of claim 1 wherein said local ALU comprises a 4-bit ALU.

5. The memory of claim 3 wherein said array comprises N number of columns of cells each accessible by said accessing circuitry in response to a column address, selected ones of said ALUs operating on data accessed from an addressed said column of cells.

6. The memory of claim 5 wherein a said column comprises M number of bitlines partitioned into P number of subsets, each said subset coupled to a corresponding one of said plurality of ALUs.

7. The memory of claim 1 wherein said array comprises an array of dynamic random access memory cells.

8. The memory of claim 1 wherein said array comprises an array of static random access memory cells.

9. The memory of claim 1 wherein said at least one ALU comprises a plurality of local ALUs and said memory further comprises a global ALU for performing operations on results output from said plurality of local ALUs.

10. The memory of claim 1 wherein said register comprises an array of static random access memory cells.

11. A memory subsystem comprising:
    an array of dynamic random access memory cells;
    an array of static random access memory cells;
    circuitry for accessing a cell of a selected one of said arrays in response to a received address bit;
    an arithmetic logic unit for receiving data from said accessed cell and selectively performing an operation thereon wherein said circuitry for accessing is operable to compare a received address bit with a stored address bit and select a one of said arrays for access in response.

12. The memory of claim 11 wherein said memory subsystem is fabricated on a single integrated circuit chip.

13. The memory of claim 11 wherein said arithmetic logic unit further comprises an input for receiving an operand, said arithmetic operation in response performing said operation on said data using said operand.

14. The memory of claim 11 wherein said arithmetic logic unit comprises a results output coupled to a port of said memory subsystem.

15. The memory of claim 11 wherein said arithmetic logic unit comprises a carry output coupled to a port of said memory subsystem.

16. The memory of claim 11 wherein said circuitry for accessing selects said array of static random access memory cells when said received address bit and said stored address bit match.

17. The memory of claim 11 and further comprising a second arithmetic logic unit for selectively performing an operation on a result output from said arithmetic logic unit.

18. A memory comprising:
    an array of dynamic random access memory cells;
    an operand register for storing a received operand for selective use in an arithmetic-logic operation;
    a result register for storing a result from an arithmetic logic operation;
    an arithmetic logic unit for selectively performing an operation on data retrieved from said array of dynamic random access memory cells and an operand retrieved from said operand register, a result of said operation output by said arithmetic logic unit for selective storage in said result register wherein said circuitry for accessing is operable to compare a received address bit with a stored address bit and select at one of said arrays for access in response.

19. The memory of claim 18 wherein said results register comprises an array of static random access memory cells.

20. The memory of claim 18 wherein said operands register comprises and array of static random access memory.

21. A method of operating a single-chip memory including an array of dynamic random access memory cells, an array of static random access memory cells, circuitry for accessing a storage location of a selected one of the arrays, and an arithmetic logic unit, the method comprising the steps of:

selecting a one of the dynamic and static random cell arrays for access in response to a received address bit;

accessing a location in the selected one of the memory array; performing an arithmetic logic operation on data from the accessed location using the arithmetic logic unit wherein said step of selecting comprises the substeps of:

comparing the received address bit with a prestored address bit; and selecting the static array for access when the received address bit and the prestored address bit match and selecting the dynamic array for access when the received address bit and the prestored address bit do not match.

22. The method of claim 21 and further comprising the step of presenting result bits output from the arithmetic logic unit at an output port of the memory via a bus.

23. The method of claim 21 and further comprising the step of writing result bits output from the arithmetic logic unit into a selected one of the arrays.

24. The method of claim 21 wherein said step of performing an operation on the accessed data comprises the step of performing and operation on the accessed data using an operand.

25. The method of claim 22 wherein said step of writing comprises the substep of reducing a number of the bits output from the arithmetic logic unit and writing a reduced number of bits to the selected array.

26. A memory system comprising:

first and second ports for exchanging data with an external device;

a first data bus for selective coupling to said first port;

a second data bus for selective coupling to said second port;

at least one bank comprising:

an array of dynamic random access memory cells;

a first static random access memory array for selectively exchanging data between said first data bus and said dynamic memory array; and a second static random access memory array for selectively exchanging data between said second bus and said dynamic memory array; and circuitry for selectively accessing said dynamic and static arrays in response to a received address bit, said circuitry for accessing comparing said received address bit with a stored address bit and accesses a one of said arrays in response wherein said at least one bank comprises a plurality of banks and said memory further comprises a global row decoder for selecting a one of said plurality of banks for access.

27. The memory of claim 26 wherein said circuitry for accessing selects at least one of said static random access memory arrays when said received address bit and said stored address bit match.

28. The memory of claim 26 wherein each said data port is associated with a dedicated read/write signal for controlling simultaneous reads and writes to said first and second static memory arrays via said first and second buses.

29. The memory of claim 26 wherein said memory comprises a single address port.

30. The memory of claim 26 wherein a simultaneous access to said first and second static memory arrays are performed during a single /RAS cycle.

* * * * *